US008828498B2

(12) United States Patent
Øllgaard

(10) Patent No.: US 8,828,498 B2
(45) Date of Patent: Sep. 9, 2014

(54) METHOD OF COATING A SURFACE WITH A WATER AND OIL REPELLANT POLYMER LAYER

(75) Inventor: Mogens Øllgaard, Smørum (DK)

(73) Assignee: Oticon A/S, Smorum (DK)

( * ) Notice: Subject to any disclaimer, the term of this patent is extended or adjusted under 35 U.S.C. 154(b) by 212 days.

(21) Appl. No.: 13/137,587

(22) Filed: Aug. 26, 2011

(65) Prior Publication Data

US 2012/0051018 A1 Mar. 1, 2012

Related U.S. Application Data

(60) Provisional application No. 61/377,473, filed on Aug. 27, 2010.

(30) Foreign Application Priority Data

Aug. 27, 2010 (EP) .................................... 10174316

(51) Int. Cl.

| | |
|---|---|
| ***C08F 2/46*** | (2006.01) |
| ***C08J 7/18*** | (2006.01) |
| ***H05H 1/00*** | (2006.01) |
| ***C25B 5/00*** | (2006.01) |
| ***C23C 16/00*** | (2006.01) |
| ***B05D 5/08*** | (2006.01) |
| ***B05D 1/00*** | (2006.01) |
| *H04R 31/00* | (2006.01) |

(52) U.S. Cl.

CPC ................ *B05D 5/083* (2013.01); *H04R 31/00* (2013.01); *B05D 1/62* (2013.01)

USPC ......... 427/488; 427/487; 204/155; 118/723 R

(58) Field of Classification Search

USPC .......................................................... 427/488

See application file for complete search history.

(56) References Cited

U.S. PATENT DOCUMENTS 3,903,581 A 9/1975 Michel
4,478,173 A * 10/1984 Doehler ........................ 118/688

(Continued)

FOREIGN PATENT DOCUMENTS

EP 1 432 285 A2 6/2004
EP 1 816 231 A1 8/2007

(Continued)

OTHER PUBLICATIONS

Bouaidat et al., "Micro patterning of cell and protein non-adhesive plasma polymerized coatings for biochip applications", Lab Chip, vol. 4, pp. 632-637, 2004 (Published online Oct. 4, 2004).

(Continued)

*Primary Examiner* — Dah-Wei D Yuan
*Assistant Examiner* — Kristen A Dagenais
(74) *Attorney, Agent, or Firm* — Birch, Stewart, Kolasch & Birch, LLP

(57) ABSTRACT

The invention provides a method of coating a surface with a water and oil repellant polymer layer. The method comprises the steps of providing a substrate with a surface, exposing the surface to a monomer compound, and exposing the surface to a continuous plasma having a plasma power provided by a plasma circuit. During the exposition of the surface to the continuous plasma, the plasma power is reduced from an initial higher plasma power to a final lower plasma power, the final lower plasma power being less than 35% of the initial higher plasma power, thus applying an even polymer layer exhibiting a water contact angle of more than 110°.

9 Claims, 9 Drawing Sheets

(56) References Cited

U.S. PATENT DOCUMENTS

| | | | | |
|---|---|---|---|---|
| 4,701,379 | A * | 10/1987 | Pearson et al. | 428/427 |
| 2005/0141738 | A1 | 6/2005 | Karamuk | |
| 2009/0318609 | A1 | 12/2009 | Badyal et al. | |

FOREIGN PATENT DOCUMENTS

| | | | |
|---|---|---|---|
| EP | 1816231 | A1 * | 8/2007 |
| WO | WO 2006/063388 | A1 | 6/2006 |
| WO | WO 2007/083122 | A1 | 7/2007 |
| WO | WO 2008/023048 | A2 | 2/2008 |
| WO | WO 2008/053150 | A1 | 5/2008 |

OTHER PUBLICATIONS

Chu et al., "Thermosensitive surfaces fabricated by plasma polymerization of N,N-diethylacrylamide", Surface & Coatings Technology, vol. 202, pp. 2047-2051, 2008 (Published online Sep. 14, 2007).
Cuong et al., "Allylamine Plasma Polymerization of Glass Surface for Antibody Immobilization: Biochips Applications", Advances in Natural Sciences, vol. 9, No. 1, pp. 93-101, 2008.
Mukhopadhyay et al., "Plasma assisted surface coating of porous solids", Applied Surface Science, vol. 201, pp. 219-226, 2002.

* cited by examiner

METHOD OF COATING A SURFACE WITH A WATER AND OIL REPELLANT POLYMER LAYER

CROSS REFERENCE TO RELATED APPLICATIONS

This nonprovisional application claims the benefit under 35 U.S.C. §119(e) of U.S. Provisional Application No. 61/377,473 filed on Aug. 27, 2010 and to Patent Application No. 10174316.9 filed in Europe, on Aug. 27, 2010. The entire contents of all of the above applications are hereby incorporated by reference.

TECHNICAL FIELD

The present invention is directed to a method of coating a surface with a water and oil repellant polymer layer by exposing the surface to be coated to a plasma.

The method is particularly useful for the coating of surfaces of portable electronic devices, e.g. communications devices or listening devices, e.g. hearing instruments and parts thereof. Devices comprising electronics and MEMS-components are sensitive to water, sweat (especially the amino acids and salts in sweat), earwax and oil. These substances may enter the casing through capillary effect between the casing parting lines or through transducer openings. A hydrophobic and oil-phobic surface coating will reduce or prevent these substances from migrating into the casing, and protect parts inside the casing against such contamination. The coating method may also be useful in coating other elements such as woven or non woven filaments, kitchen utensils, devices used in medical and dental treatment or any other products wherein oil and water repellant surface properties may be beneficial.

A water and oil repellant coating can be applied to parts of a device such as a housing or transducers or subassemblies comprising electronic circuitry through a number of processes including plasma induced polymerization.

BACKGROUND ART

Plasma induced polymerization or plasma enhanced chemical vapor deposition is a known technique of surface coating that is environmentally compatible because it allows for a solvent-free coating of objects.

Pulsed plasma polymerization is known to generate a polymer layer to repel liquids. This technique is e.g. described in EP 0 988 412 B1.

US 2009/0318609 A1 describes a continuous plasma polymerization process for applying coatings containing Nitrogen (e.g. pyridine) to a substrate to enhance adhesion and growth of biological cells.

Plasma polymerization is a process in which active species such as ions and free radicals are formed in a low pressure gas by igniting a plasma state in the gas in the presence of a monomer. It is believed that by collisions between free electrons and monomer molecules the polymerization process of the monomer is induced. The plasma is typically ignited by applying an electric field to the gas. The active species react with themselves or with monomers to form polymer coatings on the surfaces of solids that are exposed to the plasma. For plasma polymerization a plasma chamber is used wherein a low pressure gas atmosphere is created by evacuation.

Plasma polymerization takes place in a low pressure and low temperature plasma that is produced by a glow discharge in a controlled atmosphere, such as an inert gas atmosphere.

An organic monomer having active elements suitable for polymerization may be present in the inert gas and/or may be deposited on the surfaces of the material to be coated. The results of coating through plasma induced polymerization depends on a large number of variables such as: monomer flow rate, system pressure and discharge power, the reactivity of the starting monomer, the frequency of the excitation signal and the temperature of the substrate and the duration of exposure. The overall power input in plasma polymerization is used for creating the plasma and for fragmentation of monomer. Plasma is a direct consequence of the ionization of the gases present in the reactor and fragmentation leading to polymerization is believed to be a secondary process.

By the pulsed plasma polymerization process disclosed in EP 0 988 412 B1 a water and oil repellant polymer layer can be obtained that exhibits a water contact angle above 90°.

The water contact angle is the angle θ at which e.g. a droplet of water of a predetermined size meets a solid surface, as illustrated in FIG. 5.

A hydrophobic surface causes a water contact angle above 90° as illustrated in FIG. 5.

DISCLOSURE OF INVENTION

It is an object of the invention to provide an efficient process for coating a surface with a water and oil repellant layer.

According to the invention, this object is achieved by a method of coating a surface with a water and oil repellant polymer layer that comprises the steps of:

providing a substrate with a surface and exposing said surface to a continuous (non pulsed) plasma which is ignited and sustained by an electric HF power signal provided by an electric circuit.

A monomer compound is added as a vapor during and/or prior to plasma generation.

During the exposition of said surface to said continuous plasma, the plasma power is reduced from an initial higher plasma power to a final lower plasma power. The final lower plasma power is less than 35% of the initial higher plasma power. The method is carried out so as to apply an evenly distributed polymer layer to the surface of the substrate, which exhibits a water contact angle of more than 110°.

Although in the prior art pulsed plasma polymerization processes are generally preferred over a continuous plasma polymerization process it has been found that by using a low power continuous plasma polymerization process with the plasma power being controlled as pointed out above, stable process generating surface coatings with water contact angles above 110° may be achieved.

Known problems of a continuous plasma polymerization coating process are overcome by the invention. Low plasma power polymerize a monomer compound to a liquid repellant surface coating. Low plasma power is difficult to obtain. Some energy is necessary to ignite the plasma. When a continuous plasma ignite at its lowest power possible, the plasma power setting will polymerize the monomer compound in an uneven way. The coated surface will not obtain an evenly liquid repellant polymer layer. Traditionally this problem is solved by pulsing the plasma signal, turning the plasma signal on and off at regular intervals.

A stable continuous low power plasma is achieved according to the invention by igniting the plasma at high power, and over some time lower the power. The power setting on a matched plasma circuit shall be lowered to <15% and an un-matched plasma circuit to <35% of the igniting power.

Continuous low power plasma will in a coating process achieve a liquid repellant polymer surface with stable water contact angles above 110°.

Preferred further process parameters are:

RF frequency in the range between 10 MHz and 50 MHz; preferably 13.56 MHz

Plasma Power (discharge power) in the range of 0.1 W to 1 W per liter chamber

Gas pressure of the gas atmosphere in the range between 5 Pa and 70 Pa

Temperature in the plasma chamber in the range between 30° and 70° centigrade

Monomer concentration: A suitable monomer concentration is achieved by evaporation of an amount of monomer into the gas stream of inert gas which is continually injected into the reaction chamber;

Inert gas used: Argon is preferred as inert gas.

According to a preferred embodiment of the invention the plasma circuit is impedance-matched so that a maximum forward power and a minimum reflected power is achieved. The plasma circuit can be matched by means of an L-C matching unit. Electrodes are used to feed RF electric power to the low pressure gas atmosphere in the plasma chamber in order to achieve plasma conditions in the gas in the chamber. A matched plasma circuit could thus comprise an RF-generator and a L-C matching circuit.

In case the plasma circuit is matched, the final lower power is preferably less than 15% of the initial higher power used to ignite the plasma condition.

According to an alternative embedment of the invention, the plasma circuit is adjusted so that a forward power is slightly higher than a reflected power. In this case the final lower power is preferably less than 30% of the initial higher power.

The continuous low power plasma process will in only 1 to 5 minutes coat the surface with a liquid repellant polymer layer, with water contact angles above 110°. The pulsed plasma of the prior art needs about 20 minutes process time to achieve the same effect for the same batch size in the same equipment.

Further objects and features of the invention are apparent from the accompanying claims and the following description of exemplary embodiments. These are illustrated with respect to the accompanying drawings.

DETAILED DESCRIPTION OF THE INVENTION

Figure 1A:
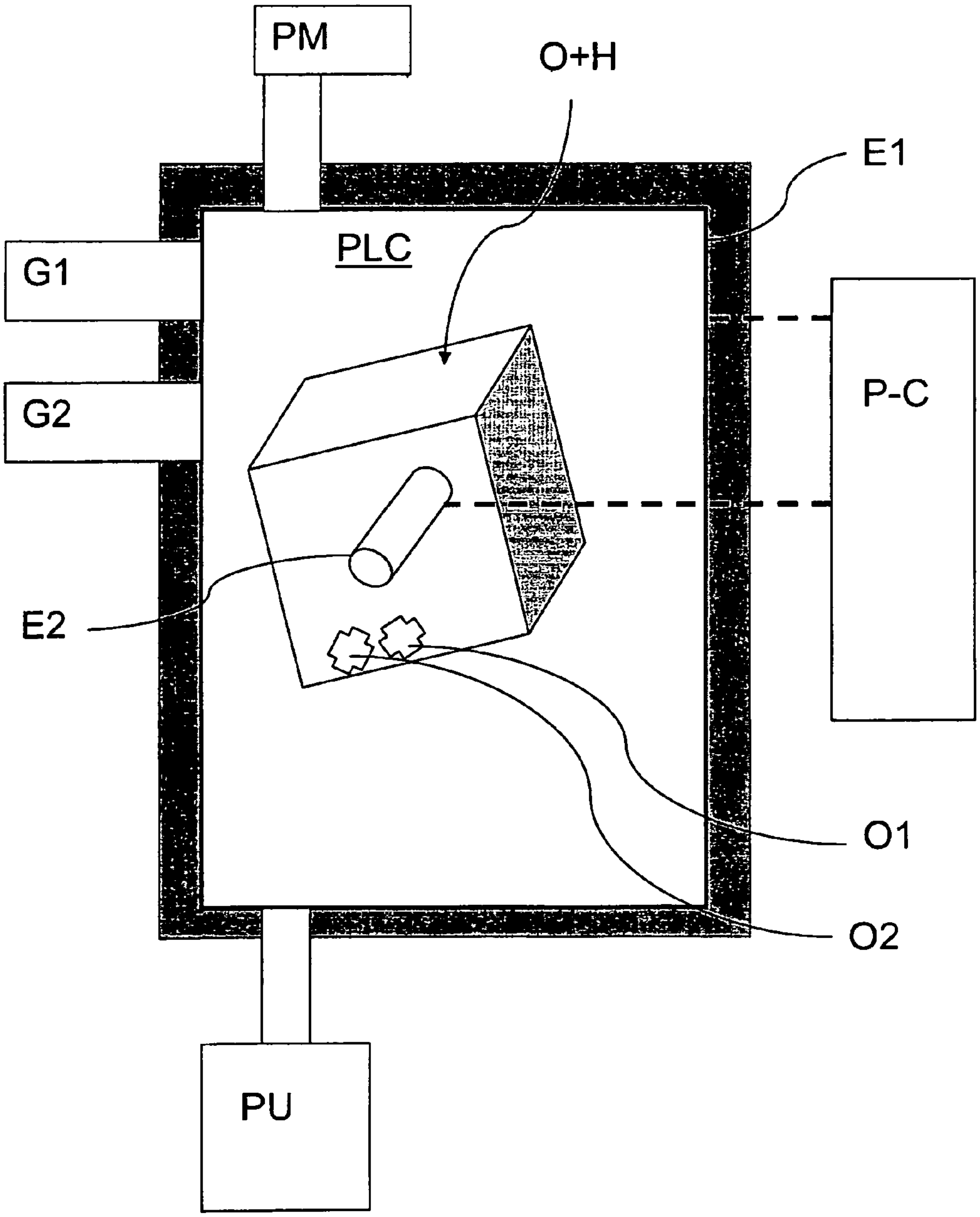
FIG. 1*a* is a diagrammatical representation of a plasma chamber setup for carrying out the invention.
Figure 1B:
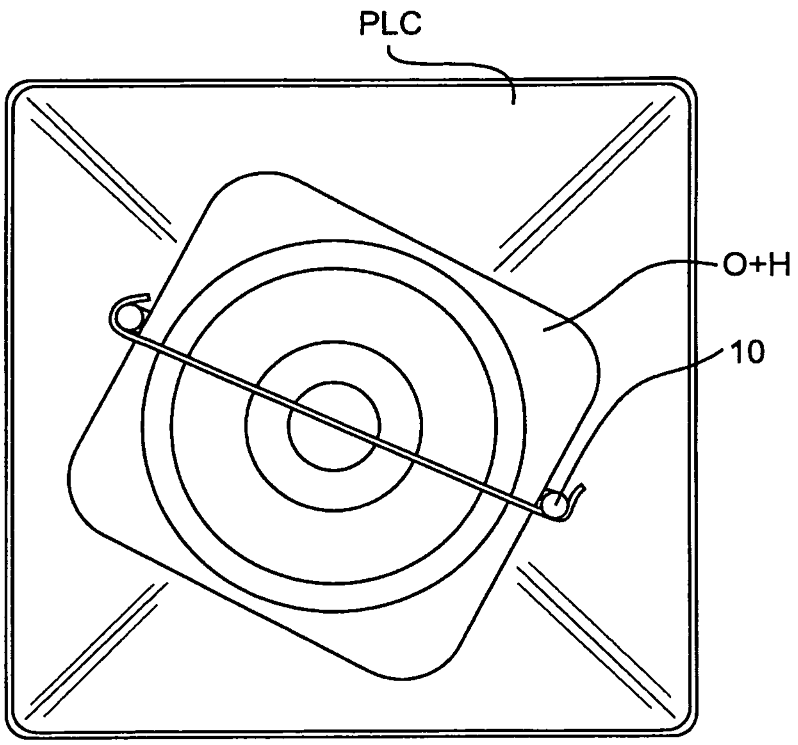
FIGS. 1*b*-1*e* illustrate the actual processing equipment.
Figure 1C:
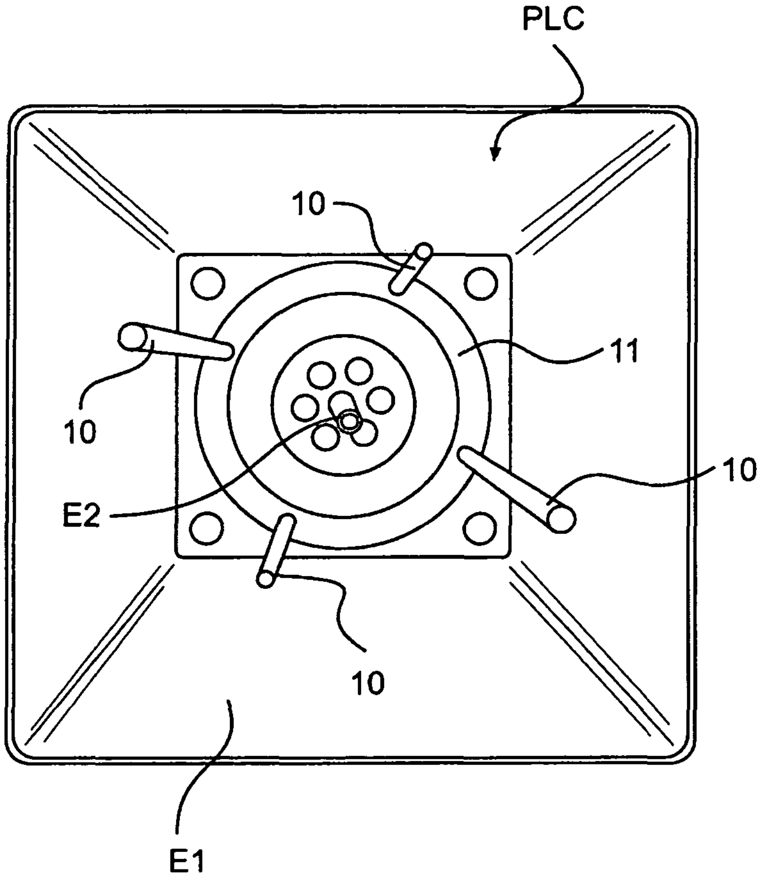
Figure 1D:
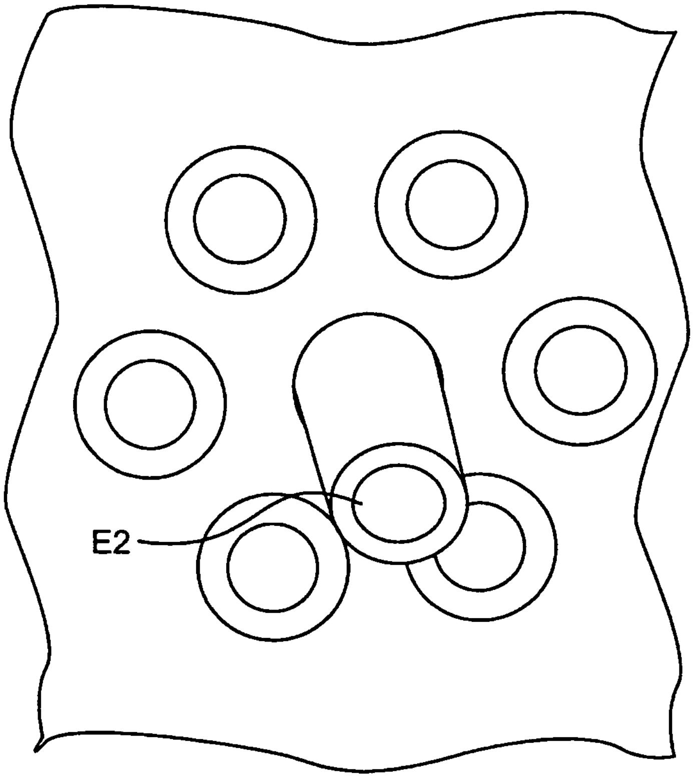
Figure 1E:
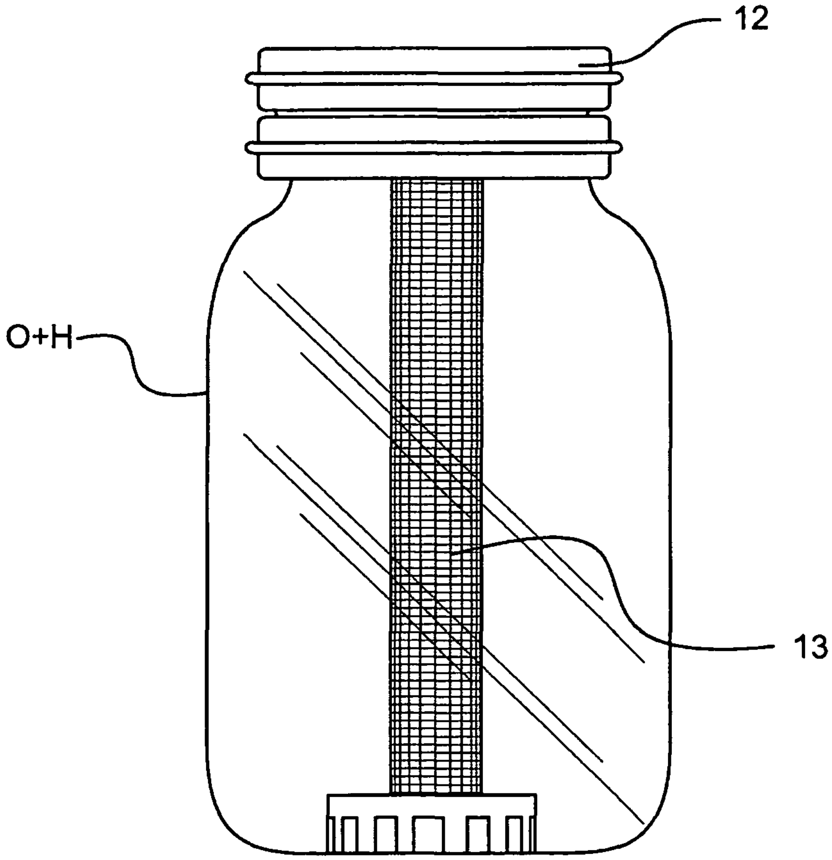
Figure 2:
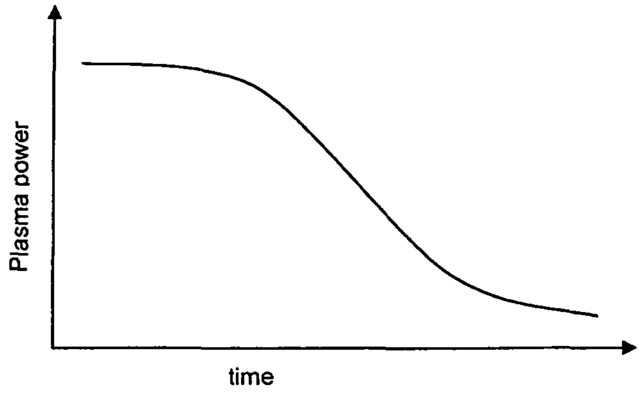
FIG. 2 is a diagram illustrating the plasma power over the time for a first embodiment of the invention.
Figure 3:
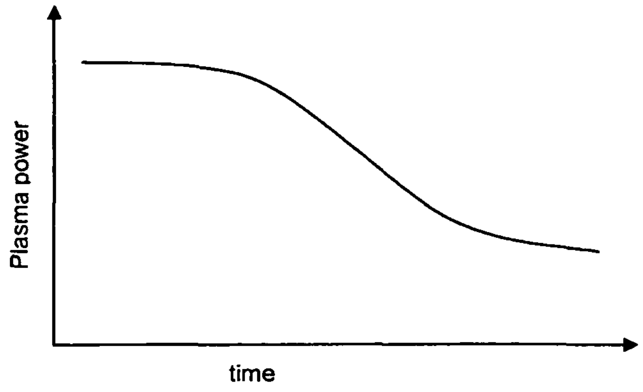
FIG. 3 is a diagram illustrating the plasma power over the time for a second embodiment of the invention.

The equipment used for carrying out the plasma polymerization process according to the invention is diagrammatically illustrated in FIG. 1. A plasma chamber PLC is provided that can be at least partly evacuated by means of a pump PU. By means of the pump PU, a low pressure gas atmosphere with a gas pressure between 5 and 70 Pa can be created in the plasma chamber PLC. After evacuation a controlled gas flow may be provided to the chamber by pump PM. The gas could be oxygen, in case a cleaning plasma operation is to be performed, or an inert gas such as argon in case a plasma induced polymerization is desired.

Two electrodes E1 and E2 are arranged within the plasma chamber PLC. In the presented embodiment the one electrode E1 is an internal metal wall of the chamber PLC. Between the electrodes E1 and E2, an object holder O+H is arranged. The object holder O+H is comprised of an open box-like structure, which may be rotated about an axis such that objects inside the box are freely tumbled when the box is rotated. Preferably the box is made of a transparent and electrically isolating material such as glass or plastic. The further electrode E2 is fixed inside the object holder O+H. The plasma circuit P-C is arranged outside the plasma chamber PLC. One terminal of the plasma circuit P-C is connected to the electrode E1 and the other terminal to the electrode E2 as indicated with dashed lines.

The plasma circuit comprises a radio frequency generator and, optionally, an impedance matching circuit, also referred to as an L-C circuit because the impedance matching circuit typically comprises a capacitor C and an inductor L. By means of the impedance matching circuit, the output impedance of the generator of the plasma circuit P-C can be matched to the input impedance of the plasma chamber PLC.

In order to perform a plasma polymerization process, the monomer is to be fed to the interior of the plasma chamber PLC. For this purpose, a monomer supply is provided in connection with pump PM, such that a monomer vapor may be added to the flow of gas provided to the chamber PLC.

In order to monitor the gas pressure in the plasma chamber, pressure gauges G1 and G2 are provided.

For performing a plasma polymerization process, a substrate (that is objects O1, O2 to be surface coated) are placed in the object holder O+H. Any number of objects which fits inside the object holder and may be tumbled therein to expose all surfaces to the plasma may be placed in the object holder. The interior of the plasma chamber PLC as well as the object holder are evacuated by means of pump PU. As the interior of the object holder O+H is in open fluid connection with the chamber PLC the same pressure and other physical condition will be present inside the object holder box. A monomer, in particular 1H,1H,2H,2H-perfluorodecyl acrylate, is fed to the interior of the plasma chamber PLC by means of monomer pump PM. A high-voltage radio frequency electric power is applied between the electrodes E1 and E2 by means of the plasma circuit P-C. An initial high plasma power is reduced within a time period of 5 second to 10 minutes to a final lower plasma power. The higher plasma power (power necessary to ignite the plasma condition of the gas), is used initially in order to cause ignition of the plasma. By the subsequent lowering of the plasma power, an even polymer layer on the substrate (object) to be coated is achieved.

The monomer compound may be represented by a compound of formula (I)

(I)

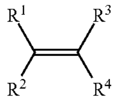

wherein $R^1$, $R^2$, and $R^3$ are independently selected from hydrogen, alkyl or haloalkyl or aryl optionally substituted by halo, provided that at least one of $R^1$, $R^2$ and $R^3$ is hydrogen;

and $R^4$ is a group X—$R^5$ wherein $R^5$ is an alkyl or haloalkyl group and X is a bond, or a group of formula —C(O)O$(CH_2)_n$Y— wherein n is an integer of from 1 to 10 and Y is a bond, or a sulphonamide group or a group —$(O)_pR^6(O)_q(CH_2)_t$ wherein $R^6$ is aryl optionally substituted by halo, p is 0 or 1, q is 0 or 1 and t is 0 or an integer of from 1 to 10.

The monomer compound preferably includes at least one optionally substituted hydrocarbon chain. Suitable chains may be straight or branched and have from 2 to 20 carbon atoms. Preferably, the chains have from 6 to 12 carbon atoms.

The monomer compound may include a double bond within a chain and comprise alkenyl compounds. Alternatively, the monomer compound may comprise an alkyl chain, optionally substituted by halogen as a substituent, which is attached to an unsaturated moiety either directly or by way of a functional group, such as an ester or sulphonamide group.

The halo and halogen groups refer to fluorine, chlorine, bromine and iodine. Fluorine is the preferred atom for the halo and halogen groups. The hydrocarbons of the present invention include alkyl, alkenyl or aryl groups. The aryl group includes aromatic cyclic groups such as phenyl or napthyl. Preferably, the aryl group is phenyl. The alkyl group includes straight or branched chains of carbon atoms. Preferably, the chains are up to 20 carbon atoms in length. The alkenyl group includes straight or branched unsaturated chains. Preferably, the chains have from 2 to 10 carbon atoms.

The monomer compound produces a coating that is water repellant when the chains of the monomer compound comprise unsubstituted alkyl or alkenyl groups. The monomer compound produces a coating that is also oil repellant when some of the hydrogen atoms in these chains are substituted with halogen atoms.

Preferably, the monomer compound includes haloalkyl moieties or haloalkenyls. Even more preferably, the haloalkyl groups for $R^1$, $R^2$, $R^3$ and $R^5$ are fluoroalkyl groups. The alkyl chains may be straight or branched and may include cyclic moieties. For $R^5$, the alkyl chains preferably comprise 2 or more carbon atoms. Even more preferably, the alkyl chains comprise from 2 to 20 carbon atoms. Most preferably, the alkyl chains comprise from about 6 to 12 carbon atoms.

For $R^1$, $R^2$ and $R^3$, alkyl chains are preferred to have from 1 to 6 carbon atoms. Preferably, $R^5$ is a haloalkyl group. More preferably, $R^5$ is a perhaloalkyl group. Most preferably, $R^5$ is a perfluoroalkyl group of formula $C_mF_{2m+1}$, where m is an integer of 1 or more. Preferably, m is from 1 to 20. Even more preferably, m is from 6 to 12. Most preferably, m is 8 or 10.

At least one of $R^1$, $R^2$ and $R^3$ is hydrogen. Preferably, $R^1$, $R^2$, and $R^3$ are all hydrogen.

In formula (I), $R^4$ is a group X—$R^5$ wherein X may be a group of formula —C(O)O$(CH_2)_n$Y— wherein n is an integer of from 1 to 10. Preferably, n is from 1 to 5. Even more preferably, n is about 2.

Preferably, the sulphonamide groups for Y in the formula —C(O)O$(CH_2)_n$Y— have the formula —N$(R^7)SO_2$ wherein $R^7$ is hydrogen or an alkyl group. The alkyl group is preferably a $C_{1-4}$alkyl. More preferably, the alkyl group is methyl or ethyl.

In a preferred embodiment, the compound of formula (I) is a compound of formula (II)

$$CH_2{=}CH{-}R^5 \qquad (II)$$

wherein $R^5$ is as defined above in relation to formula (I).

In compounds of formula (II), X in formula (I) is a bond.

In another preferred embodiment, the compound of formula (I) is an acrylate of formula (III)

$$CH_2{=}CR^7C(O)O(CH_2)_nR^5 \qquad (III)$$

wherein n and $R^5$ are as defined above in relation to formula (I) and $R^7$ is hydrogen or $C_{1-6}$ alkyl. Preferably, $R^7$ is methyl.

The monomer compound is preferred to be 1H,1H,2H,2H-perfluorodecyl acrylate.

The above steps are the basic steps required to perform coating with the plasma polymerization process, and in use they will be performed as described, however, further steps may be performed, such as plasma cleaning steps, steps for flushing the chamber and the like which are introduced when necessary or beneficial. Such additional steps are well known by the skilled artisan and are not described in any further detail.

In FIGS. 1_b_-1_e_ illustrations of various parts used in the coating process are provided. In FIG. 1_b_ the plasma chamber PLC is shown when open to the surrounding. Inside the chamber PLC the object holder O+H is seen with a fixture 10, which attaches the object holder O+H to a rotating plate 11 seen in FIG. 1_c_. In FIG. 1_c_ the electrodes E1 and E2 are indicated, the second electrode E2 being a rod extending from the center of the rotating plate 11. This is seen in an enlarged view in FIG. 1_d_. Also in FIG. 1_d_ it can be seen that the rod is actually hollow and may thus serve as both electrode and inlet opening for introduction of substances into the chamber if desired. In FIG. 1_e_ the object holder O+H is seen outside the chamber. As seen the holder is essentially a glass jar with a lid 12 at one end thereof. The lid is provided to ensure that the objects O1, O2 does not fall out during tumbling. Inside the jar or object holder O+H a protection grid 13 is provided centrally in order to protect the electrode rod E2 from the impact of free falling objects O1, O2 during tumbling and processing. The lid has a centrally placed opening (not visible in the figures) which allows the electrode E2 to enter into the object holder when the holder is placed in the fixture 10.

In the above description the chamber and the object holder are both generally square in shape, and possibly a round circular chamber and a circular object holder would better utilize the available space in the chamber, only impellers on the inside of the object holder would be needed in order to ensure that the objects to be coated are actually tumbled, when the holder is rotated.

Two different plasma polymerization processes are envisaged for coating:

Low power continuous plasma induced polymerization process 1:

The plasma circuit is matched to obtain the maximum forward power and a minimum reflected power. Plasma is ignited by high power and adjusted to low power, within 5 seconds to 10 minutes. By slowly lowering the power down to <15% of the ignition power, a stable continuous low power plasma state is obtained. Polymerization of the monomer (e.g. 1H,1H,2H,2H-Perfluorodecyl acrylate) is induced by the low power continuous plasma to achieve water droplet contact angles above 110°.

Low power continuous plasma induced polymerization process 2:

The plasma circuit is matched to obtain a forward power slightly higher than the reflected power. This is normally considered an un-matched plasma circuit. Plasma is ignited by high power and adjusted to low power, within 5 seconds to 10 minutes. By slowly lowering the power to <30% of the ignition power, a stable continuous low power plasma state is achieved. Polymerization of the monomer (e.g. 1H,1H,2H, 2H-Perfluorodecyl acrylate) is induced by the low power continuous plasma to achieve water droplet contact angles above 110°.

One of the above two plasma induced polymerization processes may be used in a specific coating scheme such as outlined in the below example:

The hydrophobic coating is performed in a standard 100 L chamber.

Example

The above processing scheme was applied to miniature switches of the kind used in hearing aids. These switches are soldered onto a PCB substrate such as a flex-print substrate, and access to the switch input is granted by way of an opening in the shell material of the hearing aid. This leaves the switch and its solder connection vulnerable to corrosion caused by sweat and other substances which may enter through the opening. Hermetically sealed switches have been made, but they add expenses to the hearing aid. A coating lacquer is customarily used to seal off vulnerable solder points in hearing aids and could in principle be used to seal off the solder points of the switch, but unfortunately capillary activity in the minute parts of the switch has a tendency to draw the lacquer into the switch and immobilize the mechanical parts thereof, rendering the switch un-functional. Surprisingly, it has been found that the above coating process of applying a coating of water and oil-repelling surface through the described process will render the switch more usable in a hearing aid setting. In a first surprising effect the coating of the entire switch, also the solder points thereof, does not, as would have been expected, have any effect on solderbillity of the switch. A usual re-flow soldering process may be conducted after the coating process. Secondly, the coating material which by nature is not electrically conductive does not affect the basic function of establishing electric contact inside the switch. Thirdly, the high temperatures witch the switch needs to go through in a re-flow solder process, leaves the coating properties intact, except at the solder points of the switch, and the capillary activity of the switch when exposed to the protective lacquer is no longer active after the coating with the hydrophobic coating process described above followed by re-flow soldering.

Figure 4A:
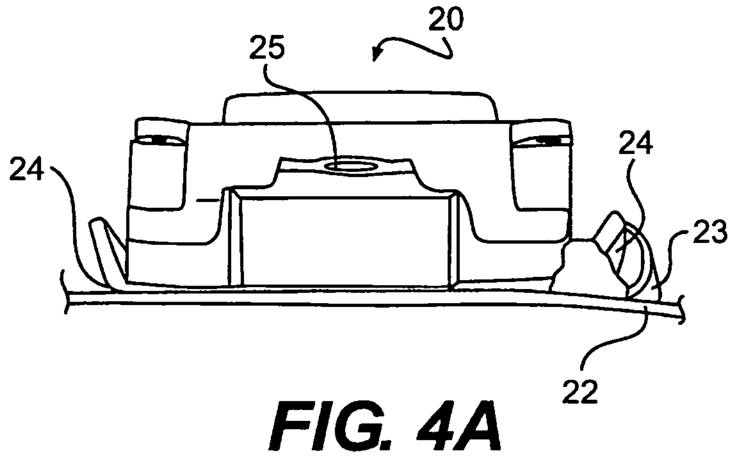
FIGS. 4*a*-4*d* show a miniature switch with and without coating.
Figure 4B:
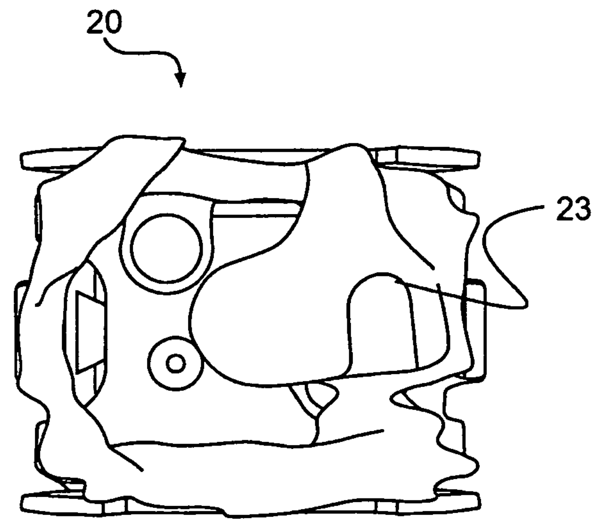
Figure 4C:
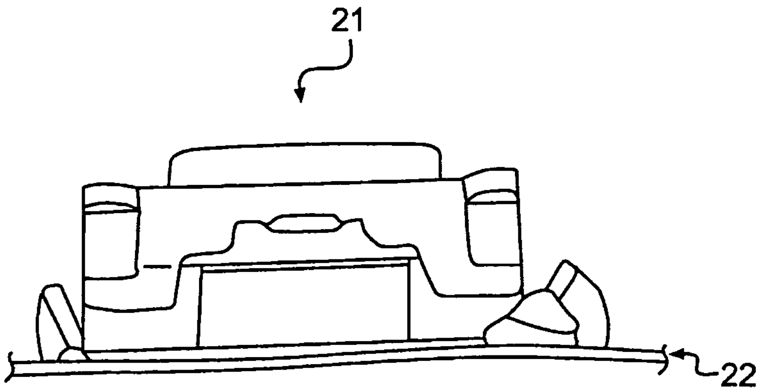
Figure 4D:
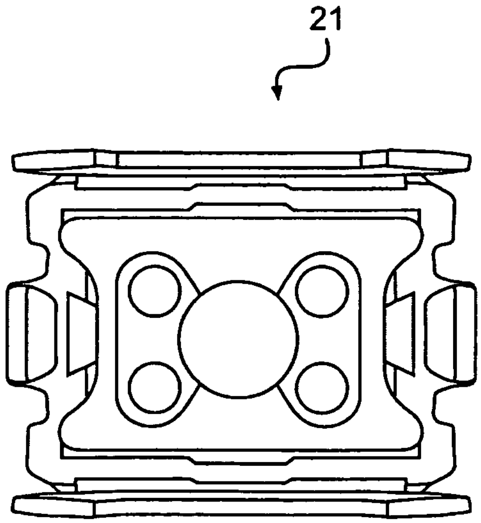
Figure 5:
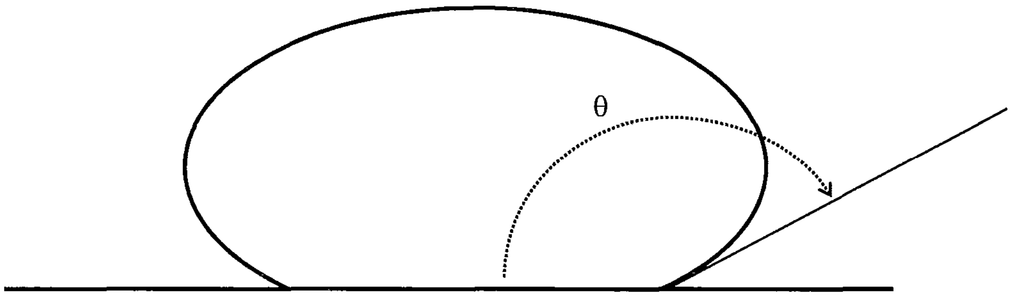
FIG. 5 shows a water contact angle caused by a hydrophobic surface.

In FIGS. 4*a*-4*d* enlarged views of switches 20,21 are shown. In FIGS. 4*a* and 4*b* a switch 20 is shown in two different views, which was not coated according to the above process of hydrophobic coating. The switch 20 was re-flow soldered to a printed circuit board such as a flex-print board 22, and lacquer was applied to the solder points 24. In FIGS. 4*c* and 4*d* an identical switch 21 is shown which was initially coated with hydrophobic coating and then subject to solder and lacquer application as the switch shown in FIGS. 4*a* and *b*.

The switch 20 is seen in a side view in FIG. 4*a*, and here red lacquer is visible in an area 25 inside the switch. This internal area is seen in FIG. 4*b*, where the lacquer 23 is clearly visible. This lacquer has entered the switch through capillary action caused by open capillary fissures embedded in the switch construction.

An identical switch 21 is seen in a side view in FIG. 4*c*. This switch was also soldered and lacquer was applied, but prior to this a plasma-induced coating process was conducted on the switch, and here no lacquer has entered into the switch 21. This is especially clear from FIG. 4*d*, where the interior of the switch is seen, and no traces of the lacquer can be identified.

The lacquer named above is one possible sealing method used to seal off solder points, but other materials are known for this purpose such as wax and the like substances, and they could be used with the described method to ensure sealing off of solder points without detrimental effects on transducer function.

The effect described above could also be used for other types of transducers, such as antennas, speakers, microphones and touch panels which are used in hearing aids, headsets and the like personal communication systems, which are worn at or near the body of users.

The invention claimed is:

1. A method of coating a surface with a water and oil repellant polymer layer, the method comprising:
- providing a plurality of objects each having a surface;
- providing a first electrode and a second electrode within a plasma chamber, the first electrode being an internal metal wall of the plasma chamber;
- providing an object holder between the first electrode and second electrode, the object holder having an open box structure, wherein the plurality of objects are positioned inside the box structure and the second electrode is fixed inside the object holder;
- rotating the object holder about an axis, thereby tumbling the plurality of objects freely within the object holder;
- exposing said surface of each of the plurality of objects to a monomer compound,
- exposing said surface of each of the plurality of objects to a continuous plasma at an initial plasma power level provided by a plasma circuit; and
- reducing the plasma power level from the initial plasma power level to a final plasma power level, said final plasma power level being less than 35% of said initial plasma power level.

2. The method of claim 1, wherein said plasma circuit is impedance-matched.

3. The method of claim 2, wherein the final lower power is less than 15% of the initial higher power.

4. The method of claim 2, wherein the final lower power is less than 30% of the initial higher power.

5. The method of claim 3 or 4, wherein said plasma power is reduced from the initial higher power to said final lower power during a time period of 5 seconds to 10 minutes duration.

6. The method of claim 1, wherein said initial higher power is in the range between 6 Watt and 12 Watt per liter plasma and the final low power is in the range of 0.1 Watt and 1.0 Watt per liter plasma in the chamber.

7. The method of claim 1, wherein the method is carried out in a gas atmosphere with a gas pressure in the range between 5 Pa and 70 Pa.

8. The method of claim 1, wherein the plasma power is supplied by a RF electric voltage with a frequency in the range between 10 MHz and 50 MHz.

9. The method of claim 1, wherein the monomer compound is 1H,1H,2H,2H-perfluorodecyl acrylate.

* * * * *